(12) United States Patent
Xiao

(10) Patent No.: US 7,737,440 B2
(45) Date of Patent: Jun. 15, 2010

(54) TEST STRUCTURE FOR CHARGED PARTICLE BEAM INSPECTION AND METHOD FOR FABRICATING THE SAME

(75) Inventor: Hong Xiao, Pleasanton, CA (US)

(73) Assignee: Hermes Microvision, Inc., Hsinchu (TW)

( * ) Notice: Subject to any disclaimer, the term of this patent is extended or adjusted under 35 U.S.C. 154(b) by 0 days.

(21) Appl. No.: 12/289,353

(22) Filed: Oct. 27, 2008

(65) Prior Publication Data

US 2010/0102316 A1    Apr. 29, 2010

(51) Int. Cl.
H01L 23/58    (2006.01)
H01L 21/00    (2006.01)
G01R 31/26    (2006.01)

(52) U.S. Cl. .................. 257/48; 438/18; 324/158.1; 257/E23.179; 257/E21.521

(58) Field of Classification Search .................. 257/48, 257/E23.179, E21.521; 438/18; 324/158.1
See application file for complete search history.

(56) References Cited

U.S. PATENT DOCUMENTS

2008/0246030 A1 * 10/2008 Satya et al. .................. 257/48

* cited by examiner

Primary Examiner—Victor A Mandala
Assistant Examiner—Whitney Moore
(74) Attorney, Agent, or Firm—Rosenberg, Klein & Lee

(57) ABSTRACT

A test structure and a method for fabricating the same are disclosed. The test structure includes a plurality of sampling lines over a substrate located between a plurality of a first grounding lines and a plurality of a second grounding lines. The sampling lines are selectively electrically coupled to the first grounding line or the second grounding line and include at least one programmed defect. A double-patterning fabricating approach is utilized to produce such test structure which may be applied to a charged particle beam such as an electron-beam defect inspection system.

9 Claims, 15 Drawing Sheets

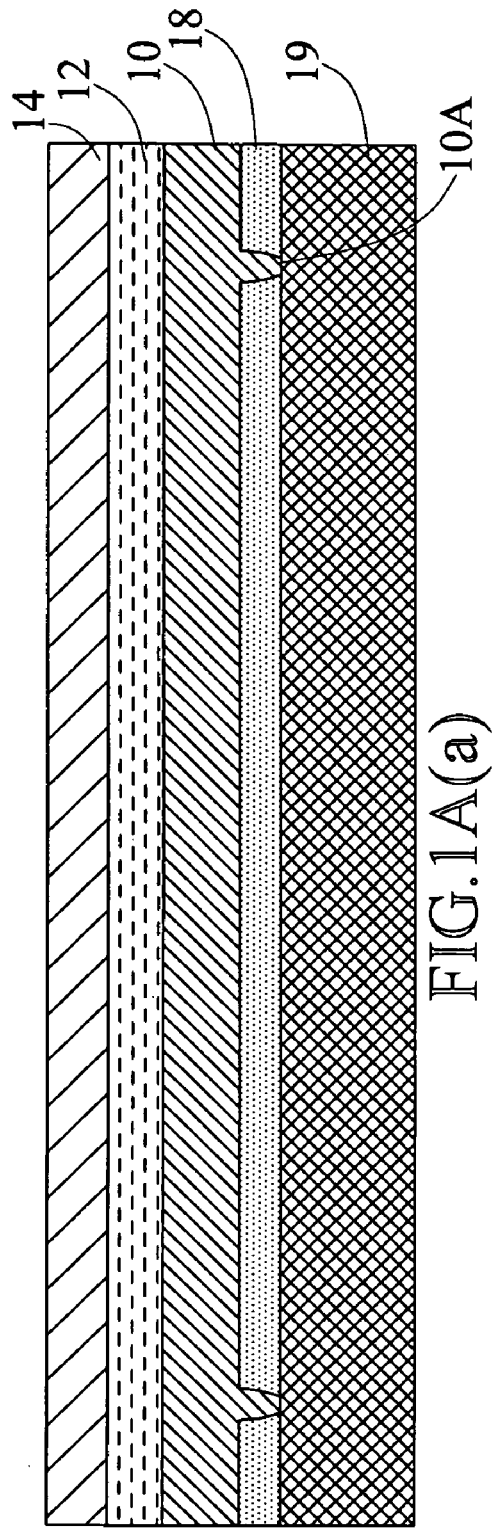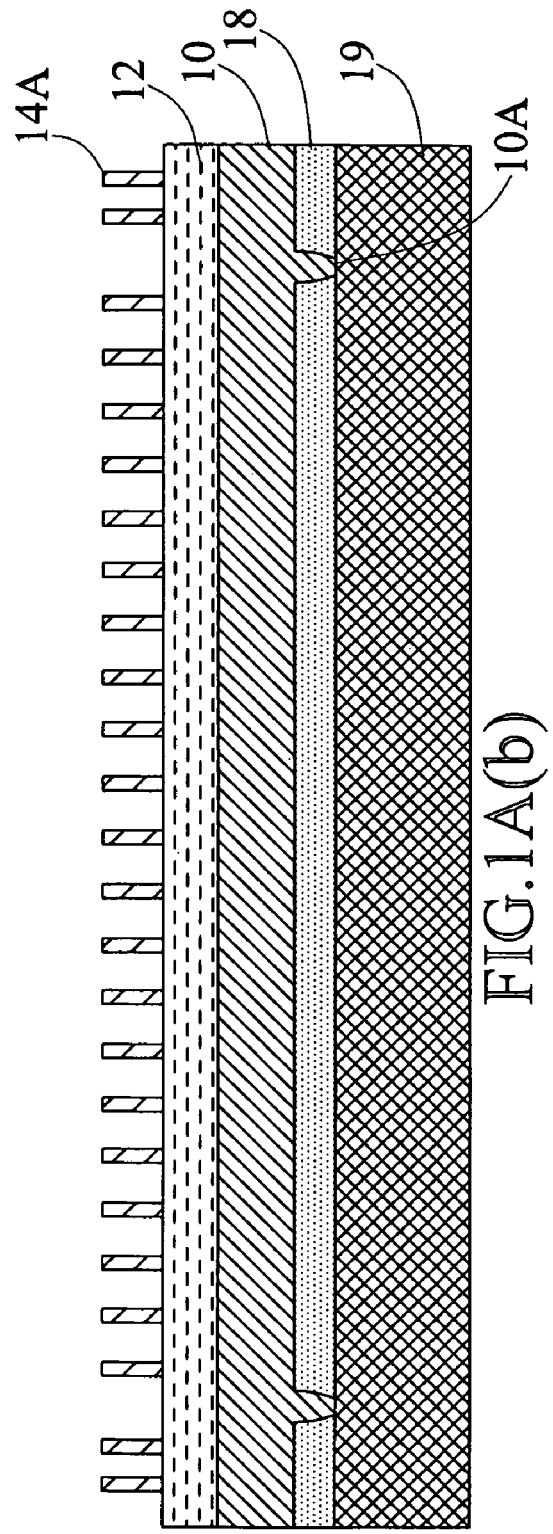

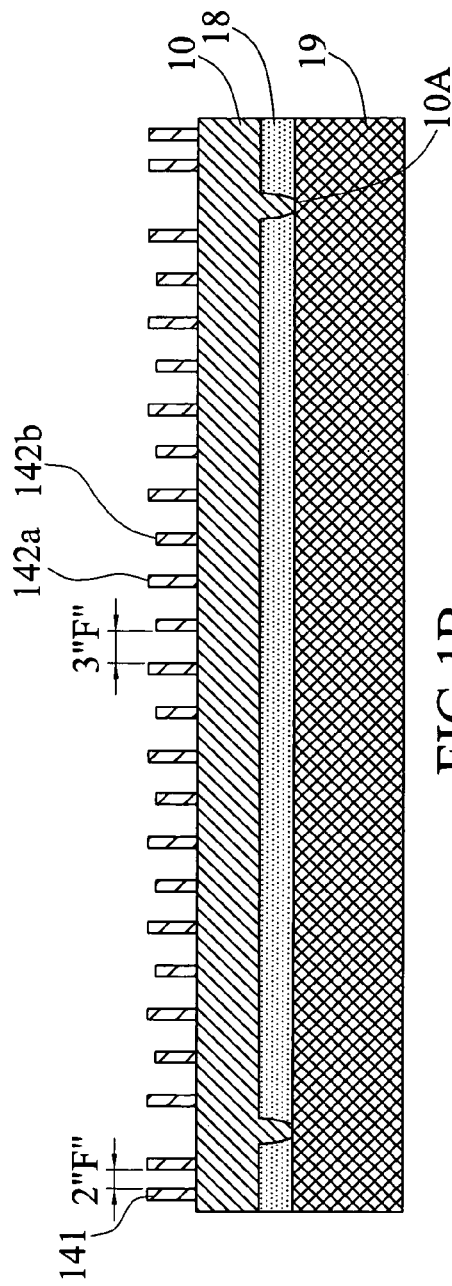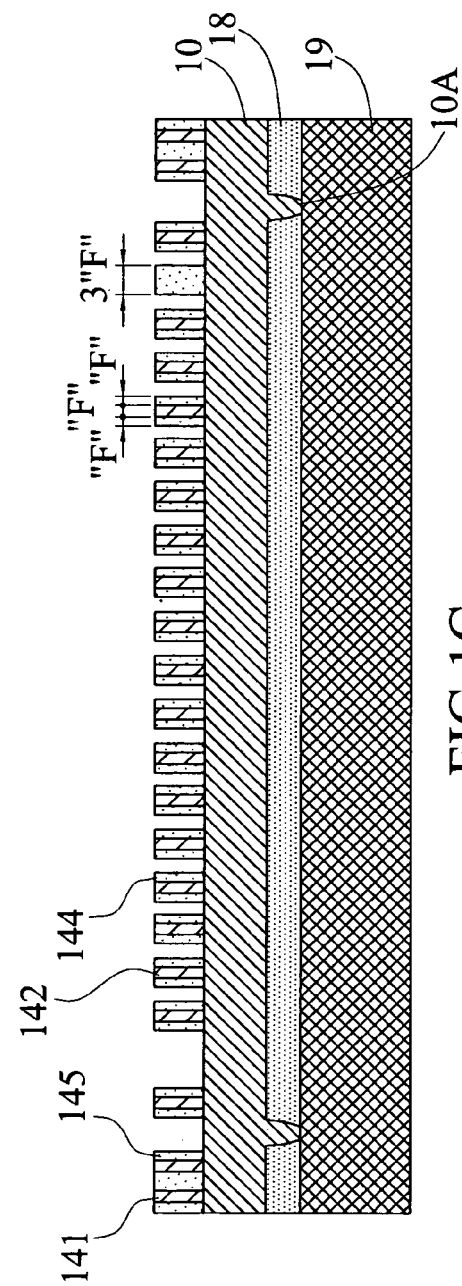

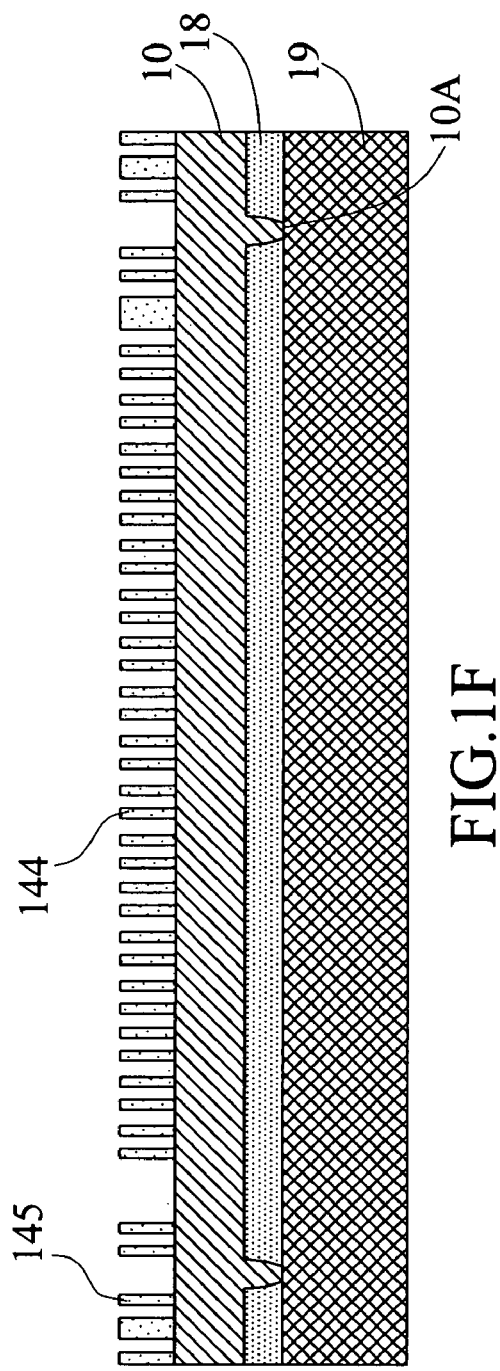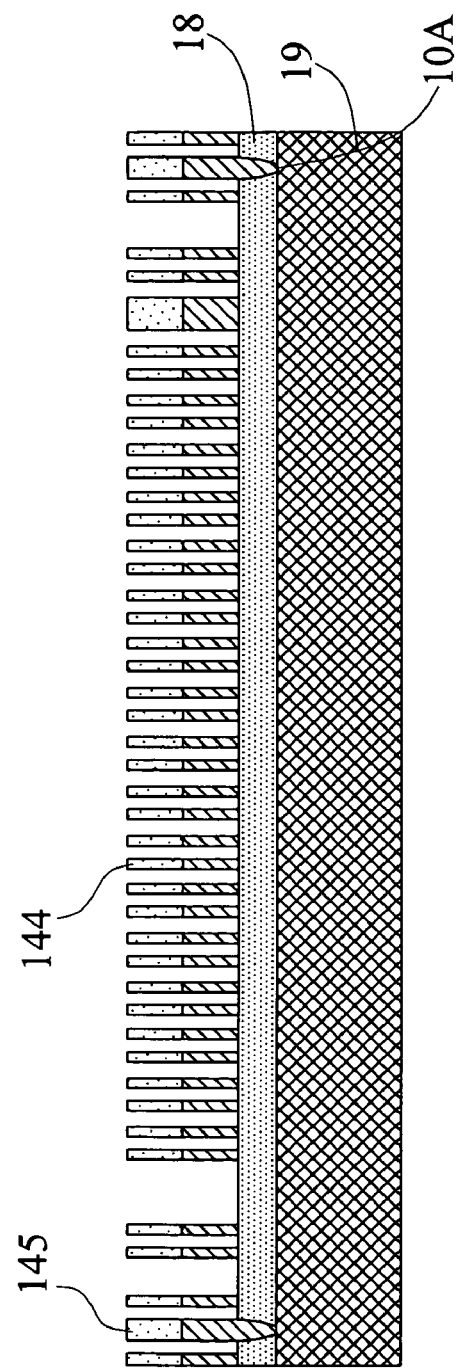

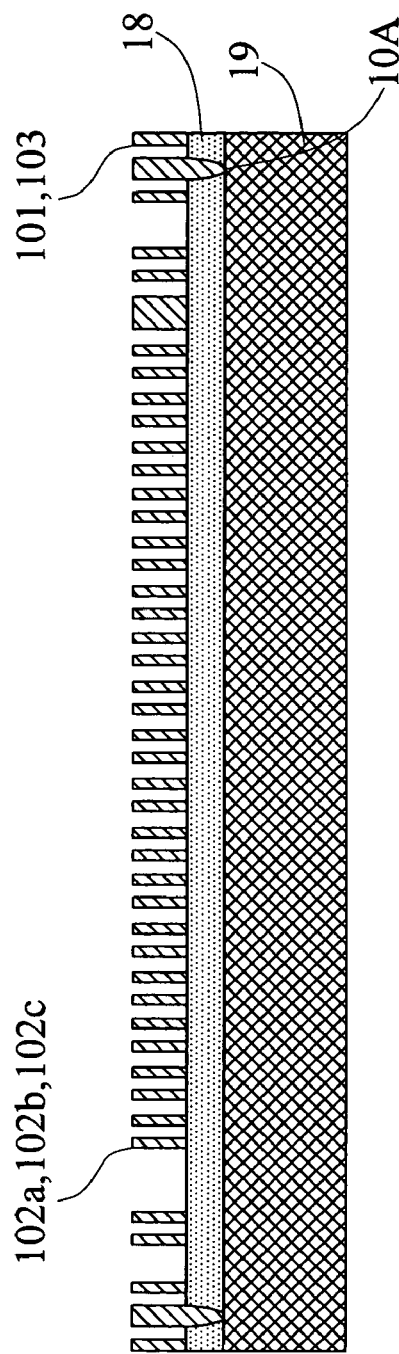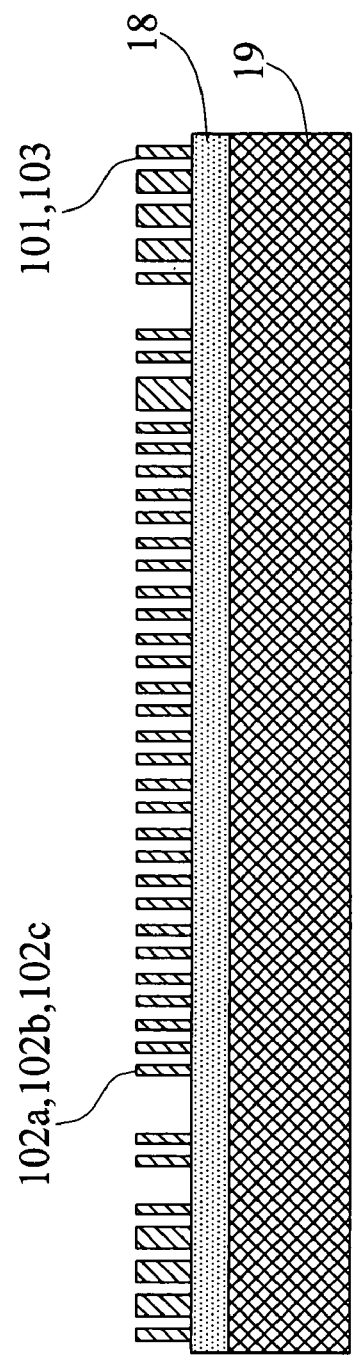

TEST STRUCTURE FOR CHARGED PARTICLE BEAM INSPECTION AND METHOD FOR FABRICATING THE SAME

BACKGROUND OF THE INVENTION

1. Field of the Invention

The present invention relates to a test structure for inspecting an electrical device; and more particularly, relates to a test structure, fabricated by double patterning technology, for inspecting an electrical device.

2. Description of the Prior Art

In material processing methodologies, pattern etching comprises application of a thin layer of light-sensitive material, such as photo-resist, to an upper surface of a substrate that is subsequently patterned to fabricate a mask suitable for transferring this pattern to an underlying thin film on a substrate. The patterning of the light-sensitive material generally involves exposure by a radiation source through a reticle (and associated optics) of the light-sensitive material using, for example, a photo-lithography system, followed by the removal of the irradiated regions of the light-sensitive material (as in a case of positive photoresist), or non-irradiated regions (as in a case of negative resist) using a developing solvent. Moreover, this mask layer may comprise multiple sub-layers.

In a pattern of dense lines and spaces printed at a fine resolution, a line width critical dimension (CD) of the lines is substantially equal to the space width of the spaces, so that the line width is half of the pitch at which the lines are disposed in the pattern. A maximum density at which lines can be printed is determined by the characteristics of a lithographic apparatus as well as the printing process. The apparatus characteristics include characteristics of the imaging system (e.g. an optical projection system) of the apparatus. The process characteristics include characteristics of exposure and development processes, and that of the resist material.

More recently, a double patterning approach has been introduced to allow patterning of smaller features at a smaller pitch than what is currently possible with standard lithographic techniques. One approach to reduce the feature size is to use standard lithographic pattern and etch techniques on the same substrate twice, thereby forming larger number of patterns spaced closely together to achieve a smaller feature size than would be possible by single exposure. In, for example, a dual-trench double patterning process for printing dense lines and spaces, a first and a second pattern of spaces are etched, in interleaved position, in a target layer. The target layer may be, for example, a sacrificial etch mask to be used for an etching of a layer underlying the target layer. Such a double patterning technique exploits the possibility to print, in a single exposure process and for a given numerical aperture (NA) and wavelength λ, a semi-dense pattern of spaces at a width $CD_{dp}$ below the value CD when the spaces are arranged at a pitch greater than $2k_1$ (λ/NA). Thus, such a pattern is not a dense pattern in the sense that the widths of the lines and spaces are equal. Instead, a width of the lines is, for example, a factor three times the width $CD_{dp}$ of the spaces. For printing such a semi dense pattern of line-shaped spaces or a semi dense pattern of trenches, wherein $CD_{dp}$<CD, generally a positive tone resist is used.

A dual-trench double patterning process for printing dense lines is characterized by the following three steps. In a first step, a first semi dense pattern of spaces is printed in resist material. After development of the resist material, the remaining resist material mask is used as etch mask for the second step. In the second step, the spaces are transferred to a target layer by applying an anisotropic etching process to the substrate, and the resist material mask is then stripped. In some cases, a Reactive Ion Etching (RIE) process is used. In a third step, the target layer is again coated with resist material, and a second semi dense pattern of spaces is printed in the resist material. The second printing is arranged such that the spaces of the second pattern are positioned interleaved with respect to spaces etched in the target layer. As a result of the interleaving, a subsequent etching of the target layer, again using an RIE process, yields lines of target layer material protruding from the surface of the substrate. By interleaving two patterns of semi dense spaces, each pattern characterized by a space width $CD_{dp}$ and a pitch $4\,CD_{dp}$, the resulting lines have a width equal to the space width $CD_{dp}$, so that a dense line pattern is obtained.

A charged particle beam imaging system, such as an electron beam imaging (EBI) system, is increasingly applied in advanced IC chip manufacturing to detect fetal defects which would result in waste devices. EBI can be used to inspect defects such as an open defect, a short defect or a leakage defect on or underneath the wafer surface by detecting voltage contrast (VC) due to the surface charge induced gray level (GL) variation. For such purpose, semiconductor test structures of various shapes, building materials and electrical characteristics have been developed to more easily identify the location of the defects. Nowadays, as the size of the semiconductor device is rapidly shrinking, test structures with finer features are needed to correctly reproduce the device at interest. Therefore, it is desirable to fabricate scaled test structures with desired pattern layout and electrical characteristics utilizing the double patterning technique, so the testing of an interested device can be realistically carried out.

SUMMARY OF THE INVENTION

The present invention is directed to a test structure fabricated by a double patterning technology.

Some embodiments of the present invention is directed to a test structure which comprises sampling lines and grounding lines, and optionally comprises programmed defects whose type and location are programmable. A programmed open defect is formed from a programmed defect pattern in the form of disconnected pattern segments with the disconnection spot size larger than twice the width of the sampling patterns from which the sampling lines are formed. A short defect is formed from a programmed defect pattern in the form of disconnected pattern segments with the disconnection spot size less than twice the width of the sampling patterns. The grounding lines of the test structure are formed from a grounding pattern that is developed along with the sampling pattern at an earlier stage in the fabrication of the disclosed test structure.

In one embodiment of the present invention, the test structure includes a plurality of sampling lines in a middle region and a plurality of grounding lines at outer regions or surrounding the middle region. Every other sampling line is grounded by electrically connected to the grounding lines, and the remainder is isolated from both the grounding lines and the grounded sampling lines. In addition, every other grounded sampling line is connected to the grounding lines at one predefined location, and the remainder is connected to that located elsewhere. The test structure is produced from an array of sampling and grounding patterns. In design, each of the sampling patterns comprises one proximal end and one distal end regarding the distance of which to the grounding patterns. The distance of the proximal ends of the sampling patterns to the grounding patterns is less than twice the width of the sampling patterns, and the distance of the distal ends of the sampling patterns to the grounding patterns is greater than twice the width of the sampling patterns.

The present invention is also directed to a method for forming a line-space test structure. The disclosed method makes use of an array of sampling and grounding patterns with designed sampling-sampling and sampling-grounding intervals such that after a double-patterning process a line-space test structure will be formed from a substrate which includes interlaced grounded and isolated sampling lines, wherein the grounded sampling lines are alternately connected to at least two groups of grounding lines located differently.

According to an embodiment, a test structure includes a first grounding line over a substrate; a second grounding line over the substrate; and a plurality of sampling lines located over the substrate and between the first grounding line and second grounding line, wherein at least one programmed defect is located in at least one of the sampling lines. A method for forming such test structure includes forming a plurality of sampling patterns and a plurality of grounding patterns over a substrate, wherein the sampling pattern comprises at least one programmed defect pattern, wherein the sampling patterns have the same width, wherein the sampling patterns are arranged such that a proximal end of the sampling patterns is located relatively closer to certain grounding patterns and a distal end of the sampling patterns is located relatively farther to these grounding patterns, and that the distance of the proximal ends of the sampling patterns from these grounding patterns is equal to or less than a predefined factor of the width of the sampling pattern, and the distance of the distal ends of the sampling patterns from these grounding patterns is equal to or greater than another predefined factor of the width of the sampling pattern. Next, a conformal layer is formed over the substrate, the sampling patterns and the grounding patterns. Next, the conformal layer is anisotropically removed, until a top portion of both the sampling patterns and the grounding patterns are exposed, to form a plurality of first spacers by the conformal layer abutting the sidewalls of the sampling patterns and a plurality of second spacers by the conformal layer abutting the sidewalls of the grounding patterns, wherein the first and second spacers have a width of yet another factor of the width of the sampling pattern, such that the first spacer at the proximal ends of the sampling patterns is in contact with the second spacer of these (aforementioned) grounding patterns and the first spacer at the distal ends of the sampling patterns is separated from the second spacer of these grounding patterns. Next, the sampling patterns, the grounding patterns and portions of the first spacers of the sampling patterns are removed such that at the proximal ends of the sampling patterns only a specific portion of the first spacer remains in contact with the second spacer of these grounding patterns, and at the distal ends of the sampling patterns the first spacers on different sidewalls of the sampling patterns are isolated from each other. Next, a portion of the substrate is removed by using the remainder first and second spacers as a mask. Next, the first and the second spacers are removed such that a plurality of sampling lines are formed underneath at locations corresponding to the first spacers, and similarly a plurality of grounding lines are formed at locations corresponding to the second spacers, wherein the sampling lines comprises at least one programmed defect at the locations of the programmed defect patterns.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

FIG. 1A(a) is a schematic cross-sectional diagram illustrating the material stack for test structure in accordance with an embodiment of the present invention.

FIG. 1A(b) is a schematic cross-sectional diagram illustrating a pattern transferred to the light sensitive layer along A-A' line of FIG. 2A in accordance with an embodiment of the present invention.

FIG. 1B is a schematic cross-sectional diagram illustrating a dummy sampling and grounding pattern along X line of FIG. 2B in accordance with an embodiment of the present invention.

FIG. 1C is a schematic cross-sectional diagram illustrating formation of the spacer over the conductive layer along A-A' line of FIG. 2C in accordance with an embodiment of the present invention.

FIG. 1F (along A-A' line of FIG. 2F) is a schematic cross-sectional diagram illustrating the formation of spacer pattern on the conductive layer by removing dummy pattern in accordance with an embodiment of the present invention.

FIG. 1G is a schematic cross-sectional diagram illustration of etching the conductive layer using the spacer pattern as a mask in accordance with an embodiment of the present invention.

FIG. 1H (along A-A' line of FIG. 2G) is a schematic cross-sectional diagram illustrating the formation of conductive layer pattern by removing the spacer pattern in accordance with an embodiment of the present invention.

FIG. 1I is a schematic cross-sectional diagram illustrating a test structure in accordance with an embodiment of the present invention.

DETAILED DESCRIPTION OF EXAMPLE EMBODIMENTS

Figure 1D:
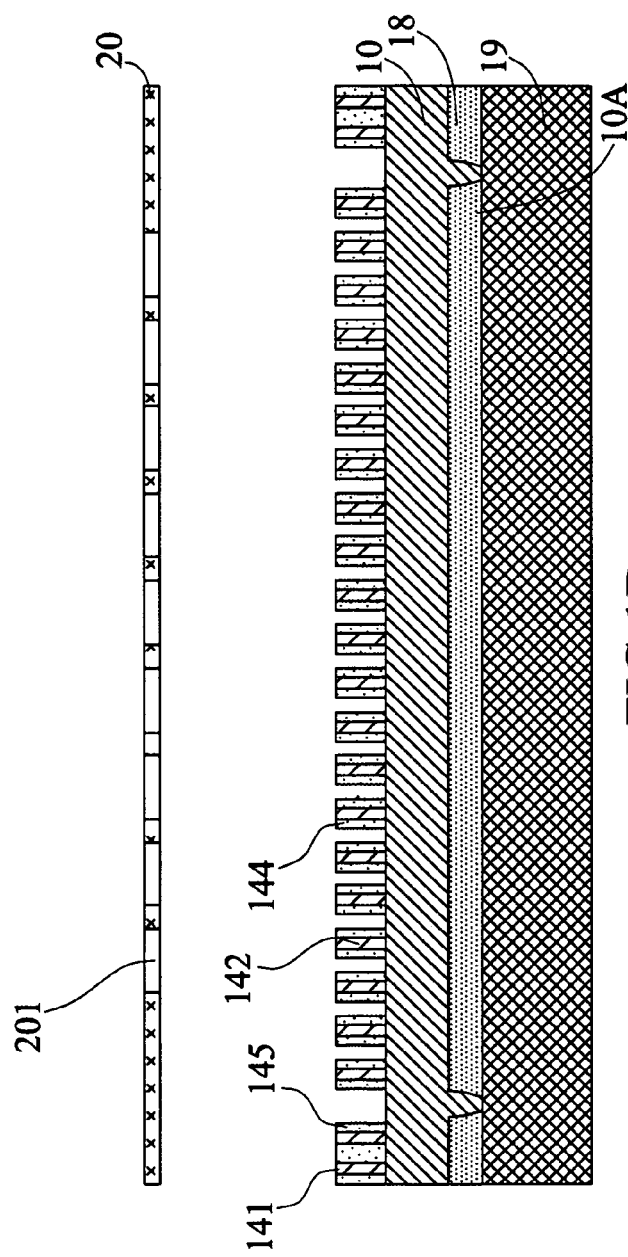
FIG. 1D is a schematic cross-sectional diagram illustrating the formation of a tip-cut pattern of the spacers along A-A' line of FIG. 2D in accordance with an embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

An exemplary line-space test structure is implemented by a double patterning process. The exemplary test structure includes a plurality of grounding patterns and a plurality of sampling patterns. The sampling patterns are designed to form a plurality of sampling lines in which some are grounded and some are floating. The formed sampling lines are designed to be in a line-space array where grounded and floating sampling lines are interlaced. One or more programmed defects are designed to be located on the sampling lines for testing. The type and location of the defects are programmable. The double patterning process with a plurality of masks is described in company with the exemplary figures in the following.

FIG. 1A(a) is a schematic cross-sectional diagram illustrating the material stack for fabricating a test structure in accordance with an embodiment of the present invention. As shown, a light sensitive layer 14 is disposed on a dummy pattern layer 12 which is disposed on a conductive layer 10. Further, the conductive layer 10 is disposed on a dielectric layer 18 which is disposed on a substrate layer 19. It is noted that the dielectric layer 18 electrically separates the conductive layer 10 from the substrate 19. It is also noted that a plurality of contact holes 10A are formed through the dielectric layer 18 to electrically connect the conductive layer 10 to the substrate 19. Referring to FIG. 2A, a first mask 16 is provided for transferring patterns onto the light sensitive layer 14 of FIG. 1A(a). Note that the sign "F" represents a unit width for the purpose of illustration. A schematic cross-sectional illustration of the patterned light sensitive layer is shown in FIG. 1A(b). FIG. 2A is a schematic top-view diagram illustrating the first mask 16 in accordance with an embodiment of the present invention. As shown, the illustrated first mask 16 includes a plurality of sampling patterns 162 in a middle region of the first mask 16 and a plurality of grounding patterns 161 positioned at the periphery of the first mask 16 and surrounding the middle region.

In this embodiment, the unit width "F" is designed to be the width of the sampling pattern 162. All sampling patterns 162 have the same width. The distance between any two neighboring grounding patterns 161 is equal to or less than 2"F" i.e. the distance between any two neighboring grounding patterns 161 is equal to or less than twice the width of the sampling patterns 162. The distance between any two neighboring sampling patterns 162 is larger than 2"F" i.e. the distance between any two neighboring sampling patterns 162 is greater than twice the width of the sampling patterns 162. In this embodiment, merely for example, the distance between any two neighboring grounding patterns 161 is designed to be 2"F", and the distance between any two neighboring sampling patterns 162 is designed to be 3"F" as shown in FIG. 2A. The sampling patterns 162 are arrayed such that each sampling pattern 162 has a proximal end 162a and a distal end 162, with the proximal ends 162a located relatively closer to the grounding patterns 161 at certain fixed location and the distal ends 162b relatively farther to these certain grounding patterns 161, respectively. The distance of the proximal ends 162a of the sampling patterns 162 to these grounding patterns 161 may be equal to or less than a predefined factor of the width of the sampling pattern 162, and the distance of the distal ends 162b of the sampling patterns 162 to these grounding patterns 161 may be equal to or greater than another predefined factor of the width of the sampling pattern 162. As shown in FIG. 2A, in this embodiment, merely for example, the distance of the proximal ends 162a to these grounding patterns 161 is 2"F" i.e. twice the width of the sampling patterns 162, and the distance of the distal ends 162b to these grounding patterns 161 is 3"F" i.e. three times the width of the sampling patterns 162.

In addition, one or more programmed defect patterns are optionally incorporated in the disclosed test structure. In the present invention, a short defect can be designed to be formed from a programmed defect pattern in the form of disconnected pattern segments with the disconnection spot size equal to or less than twice the width of the sampling patterns 162. On the other hand, an open defect can be formed from the programmed defect pattern in the form of disconnected pattern segments with the disconnection spot size larger than twice the width of the sampling patterns 162. For example, as shown FIG. 2A, a gap 162c with the size 2"F" may be used to form a short defect in the sampling patterns 162, and a gap 162d with the size 3"F" may be used to form an open defect in the sampling patterns 162.

As described earlier, a pattern 14A is first transferred onto the light sensitive layer 14 using the first mask 16, as illustrated in FIG. 1A(b). The pattern 14A formed from the light sensitive layer 14 is then used as a mask to form a plurality of "dummy" sampling patterns 142 and grounding patterns 141 from the dummy pattern layer 12, as illustrated in FIGS. 1B and 2B. The dummy patterns are so referred to as it will eventually be removed. The top-view layout of the dummy sampling patterns 142 and grounding patterns 141 are illustrated in FIG. 2B. On the other hand, FIG. 1B is a schematic cross-sectional diagram along the line X of FIG. 2B as an illustration of viewing the sampling patterns 142 from the upper grounding patterns 141. As shown, from the view point of the upper grounding patterns 141, the proximal end 142a and the distal end 142b of the sampling patterns 142 show in alternation. It is noted that, as shown in both FIG. 1B and FIG. 2B, in this example embodiment the distance between any two neighboring grounding patterns 141 is 2"F" or twice the width of the sampling patterns 142, and the distance between any two neighboring sampling patterns 142 is 3"F" or three times the width of the sampling patterns 142. In addition, the distance of the proximal ends 142a of the sampling patterns 142 to the grounding patterns 141 is 2"F" or twice the width of the sampling patterns 142, and the distance of the distal ends 142b of the sampling patterns 142 to the grounding patterns 141 is 3"F" or three times the width of the sampling patterns 141. These numbers should not be surprising as they are resulted from the mask 16 implemented in FIG. 1A and FIG. 2A. It is also noted that a short defect pattern 142c is formed from a programmed defect pattern in the form of disconnected pattern segments with the disconnection spot size equal to 2F or twice the width of the sampling patterns 142. Moreover, an open defect pattern 142d is formed from the programmed defect pattern in the form of disconnected pattern segments with the disconnection spot size equal to 3"F" or three times the width of the sampling patterns 142.

FIG. 1C is a schematic cross-sectional diagram illustrating the formation of spacers over the conductive layer 10 in accordance with an embodiment of the present invention; FIG. 1C is a cross-sectional diagram of line A-A' in FIG. 2C which is a top-view of the layout of the formed spacers. To form the spacers a conformal layer is first formed over the sampling patterns 142, the grounding patterns 141 and the conductive layer 10. A portion of the conformal layer is then anisotropically removed to expose both the sampling patterns 142 and the grounding patterns 141 on the top, wherein a plurality of first spacers 144 are formed from the conformal layer abutting the sidewalls of the sampling patterns 142 and a plurality of second spacers 145 are formed from the conformal layer abutting the sidewalls of the grounding patterns 141. In the present example, the first and second spacers 144 and 145 are designed to have a width of yet another factor of the width of the sampling pattern 142, such that the first spacer 144 at the proximal ends 142a of the sampling patterns 142 is in contact with the second spacer 145 of the grounding patterns 141, and the first spacer 144 at the distal ends 142b of the sampling patterns 142 is separated from the second spacer 145 of the grounding patterns 141. For example, as illustrated in FIG. 2C, the first and second spacers 144 and 145 can be designed to have a width "F" as the sampling patterns 142. In such case, at the proximal end 142a which is only 2"F" far from the grounding patterns 141, there is no sufficient room to fit in both the first and second spacers 144 and 145, therefore the two spacers 144 and 145 will inevitably touch each other. On the contrary, at the distal end 142b which is 3"F" far from the grounding patterns 141, the two spacers 144 and 145 will be separated from each other due to excessive room between the sampling and grounding patterns 142 and 141.

Figure 2A:
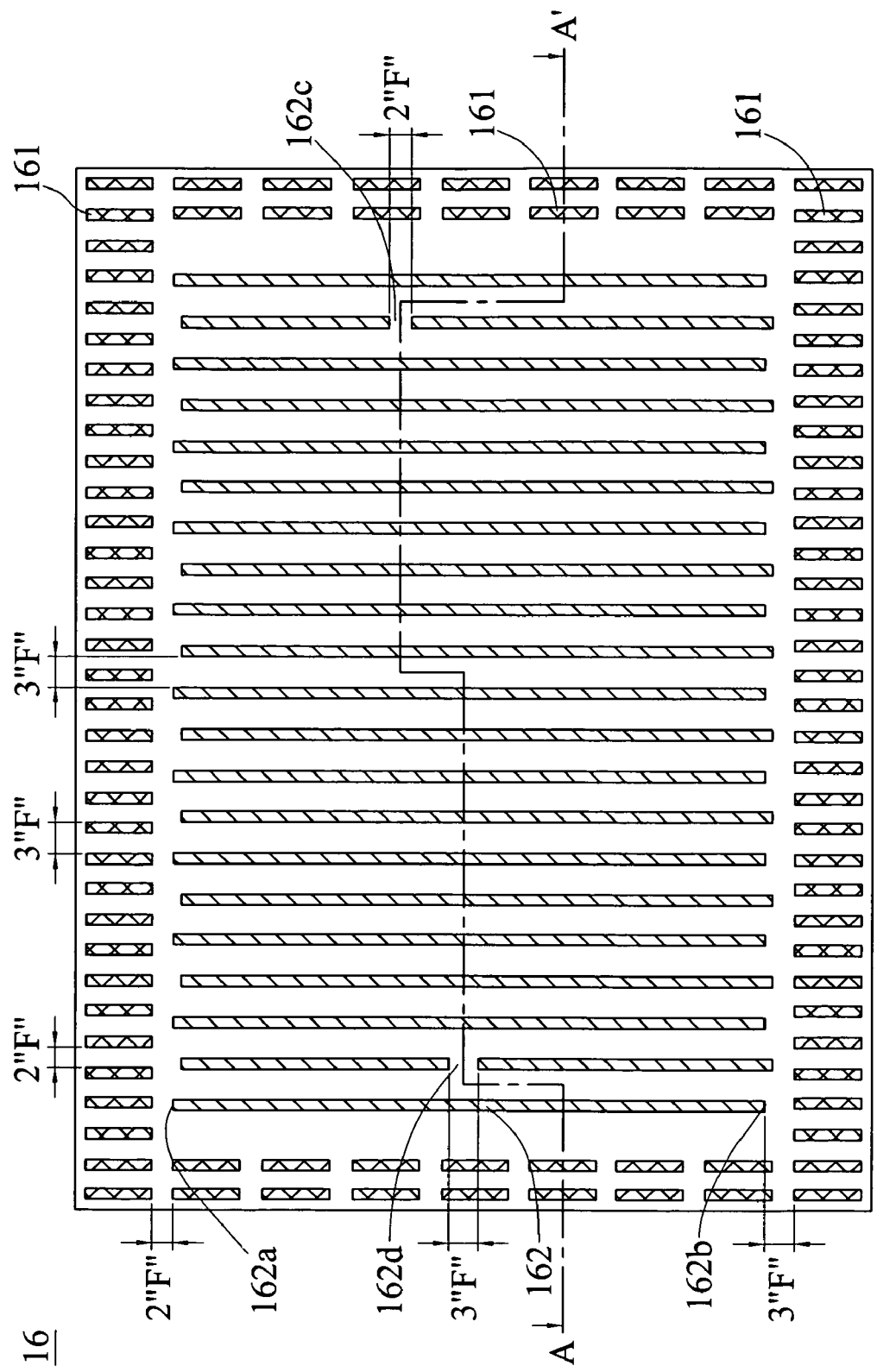
FIG. 2A is a schematic top-view diagram illustrating a first mask for transferring patterns to the material stack of FIG. 1A(a) in accordance with an embodiment of the present invention.
Figure 2B:
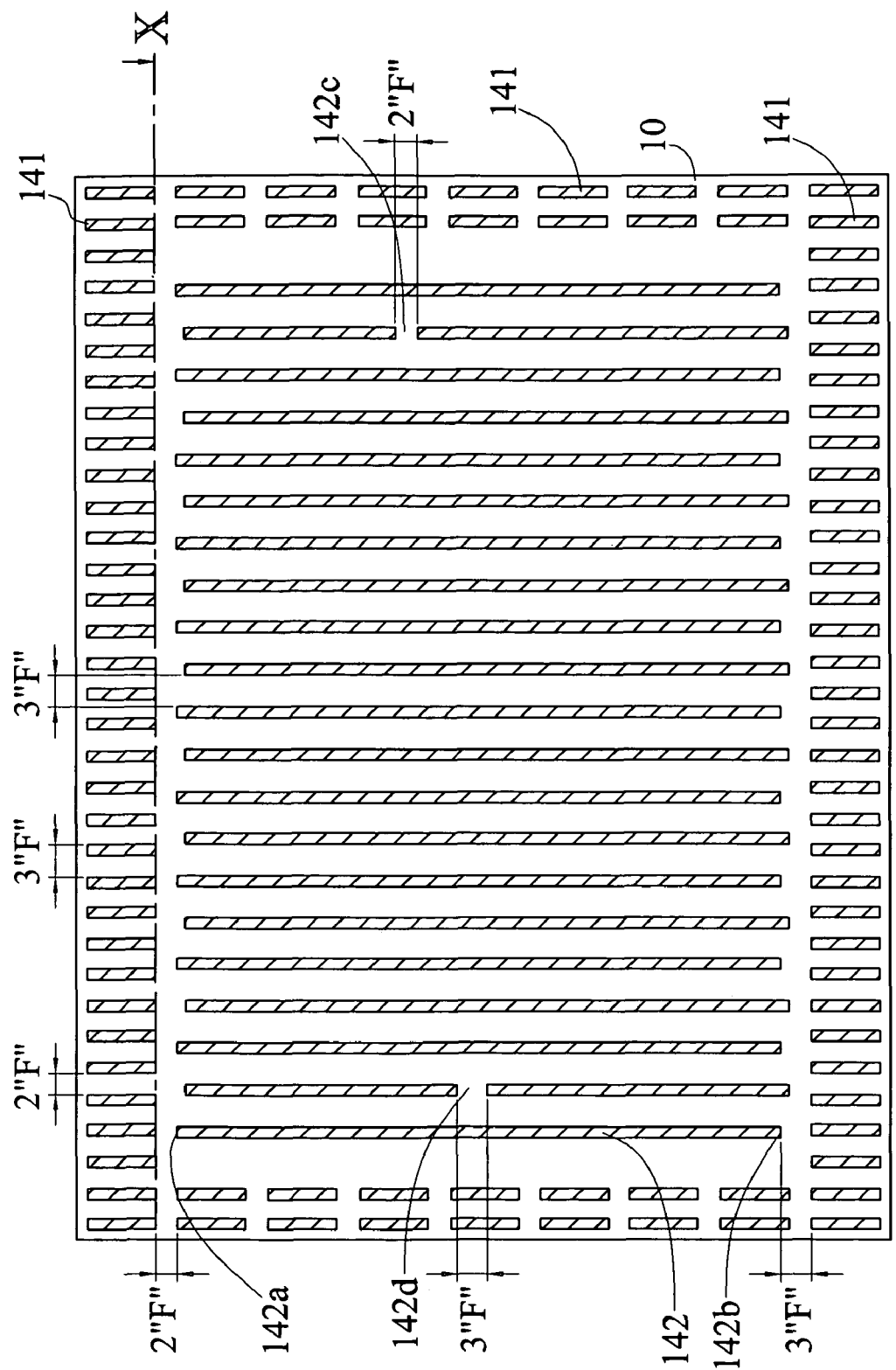
FIG. 2B is a top-view layout of dummy sampling and grounding patterns.
Figure 2C:
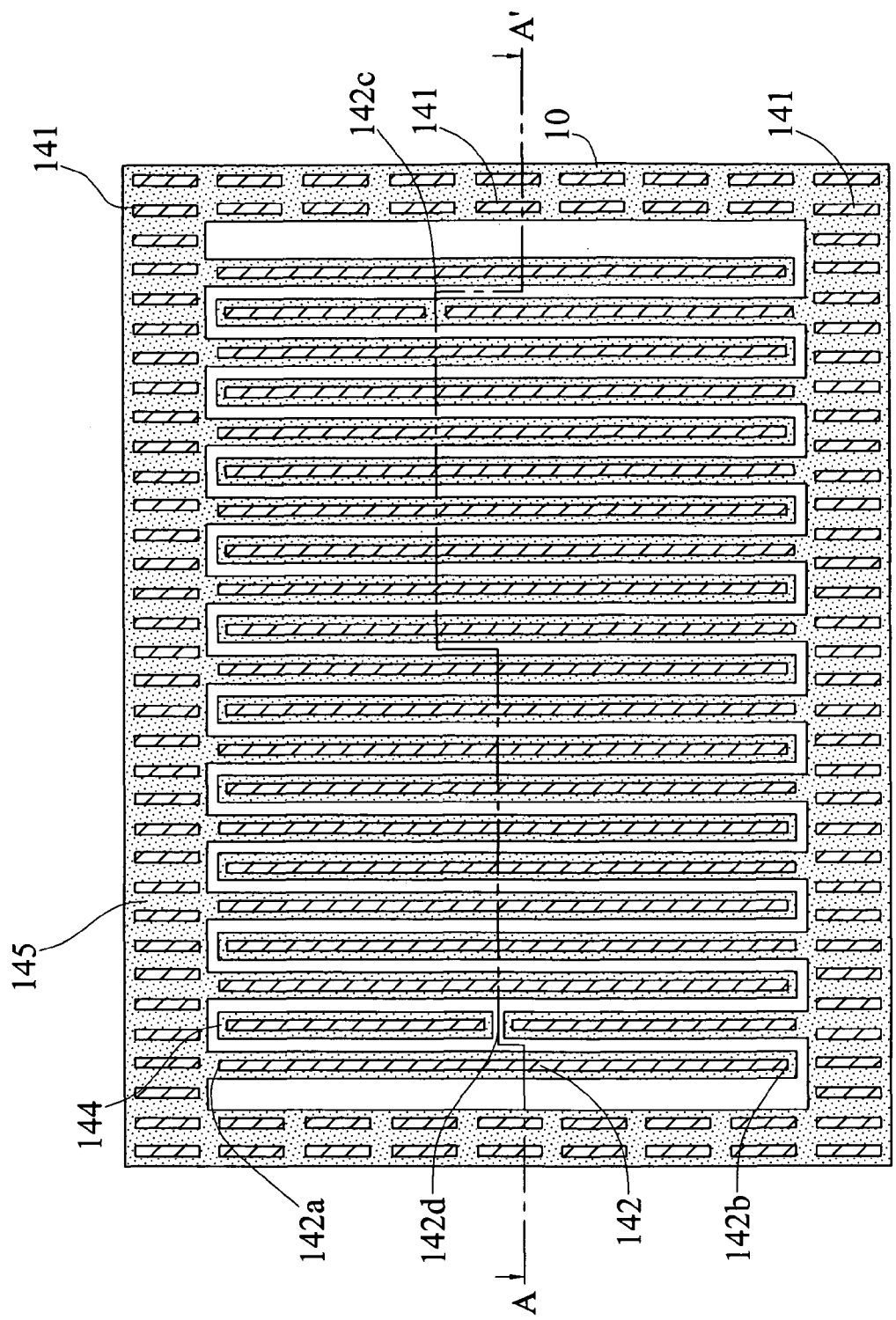
FIG. 2C is a schematic top-view diagram illustrating a layout of the spacer in accordance with an embodiment of the present invention.
Figure 2D:
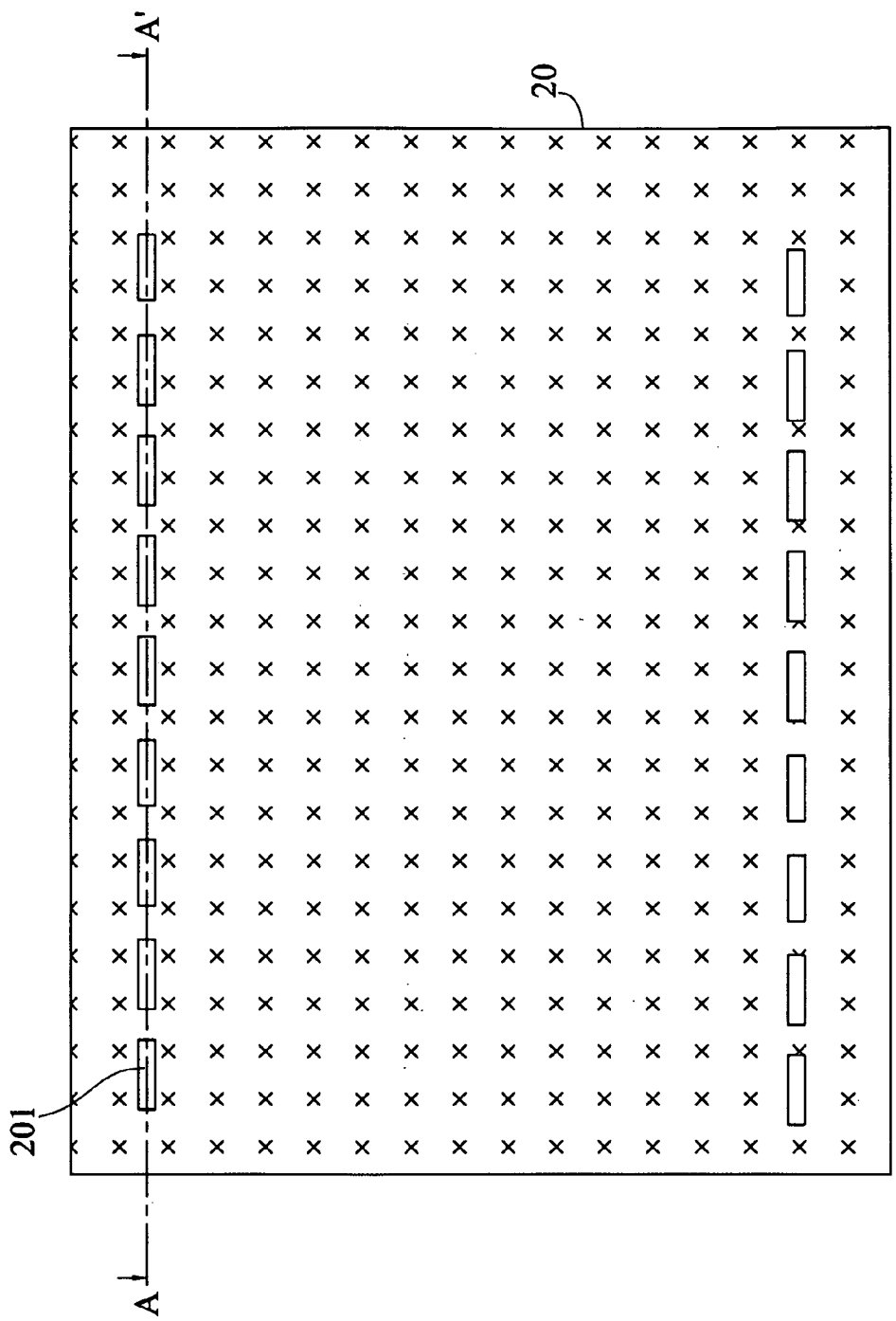
FIG. 2D is a schematic top-view diagram illustrating a layout of a tip-cut mask in accordance with an embodiment of the present invention.
Figure 2E:
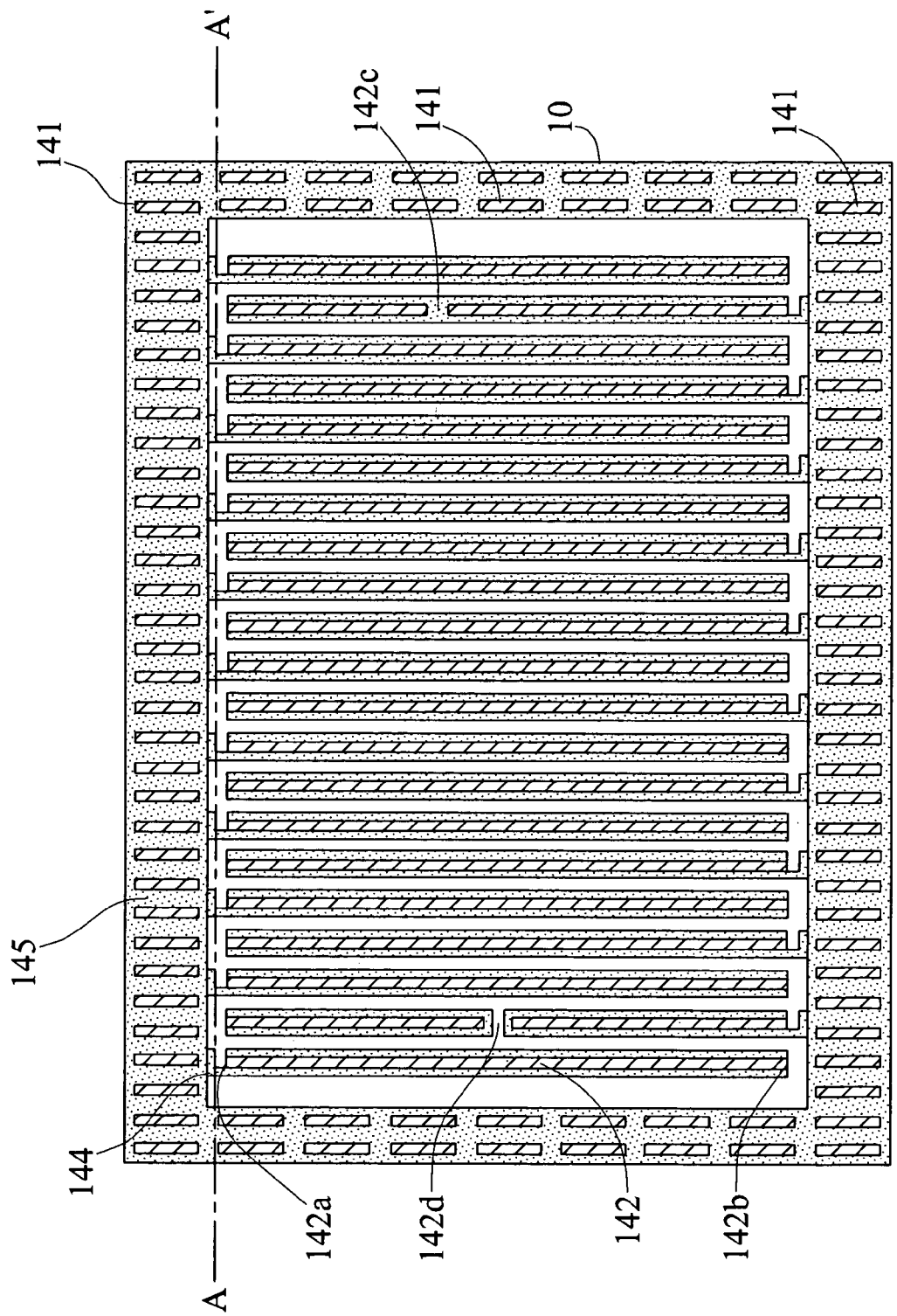
FIG. 2E is a schematic top-view diagram illustrating the layout of the tip-cut spacer in accordance with an embodiment of the present invention.

FIG. 1D is a schematic cross-sectional diagram illustrating the formation of a tip-cut pattern of the spacers in accordance with an embodiment of the present invention. In this step, a tip-cut mask 20 is placed over the material stack to transfer a tip-cut pattern of spacers on the conductive layer 10. FIG. 2D is a schematic top-view diagram illustrating the layout of the tip-cut mask 20 in accordance with an embodiment of the present invention. The tip-cut patterns 201 on the tip-cut mask 20 is configured for removing a portion of the first spacers 144 (and optionally a portion of the second spacers 145) between the grounding patterns 141 and the sampling patterns 142. The tip-cut patterns 201 are formed between the sampling pattern 142 and the grounding pattern 141 such that after the suitable removal process of the first spacers 144, at the proximal end 142a of each sampling patterns 142 one out of the two first spacers 144 on the opposite side walls of the sampling pattern 142 which are connected to the second spacer 145 remains in contact with the second spacer 145, while the other is separated from the second spacer 145; and at the distal end 142b of each sampling patterns 142, the two first spacers 144 on the opposite sidewalls of the sampling pattern 142 are isolated from each other, as shown in FIG. 2E. In addition, comparing FIGS. 2D and 2E, the upper and lower tip-cut patterns are designed to be spatially misaligned thereby rendering an alternation in the connection of the proximal first spacer 144 to the upper and lower grounding patterns 141.

Figure 1E:
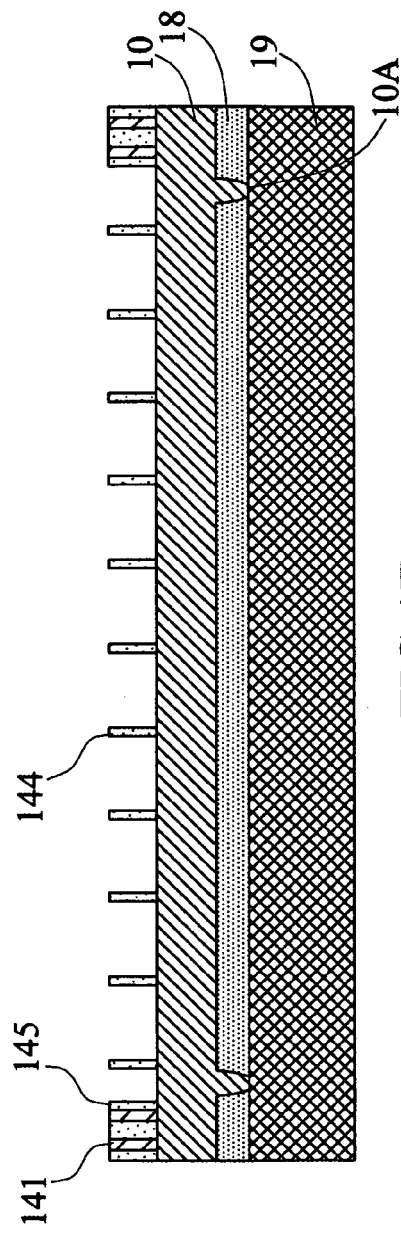
FIG. 1E is a schematic cross-sectional diagram illustrating tip-cut sampling pattern along A-A' line of FIG. 2E.

FIG. 1E is a schematic cross-sectional diagram illustrating tip-cut sampling pattern along A-A' line of FIG. 2E. It can be seen by comparing FIG. 1E and FIG. 1D that a portion of the first spacers 144 between the grounding patterns 141 and the sampling patterns 142 have been removed.

Figure 2F:
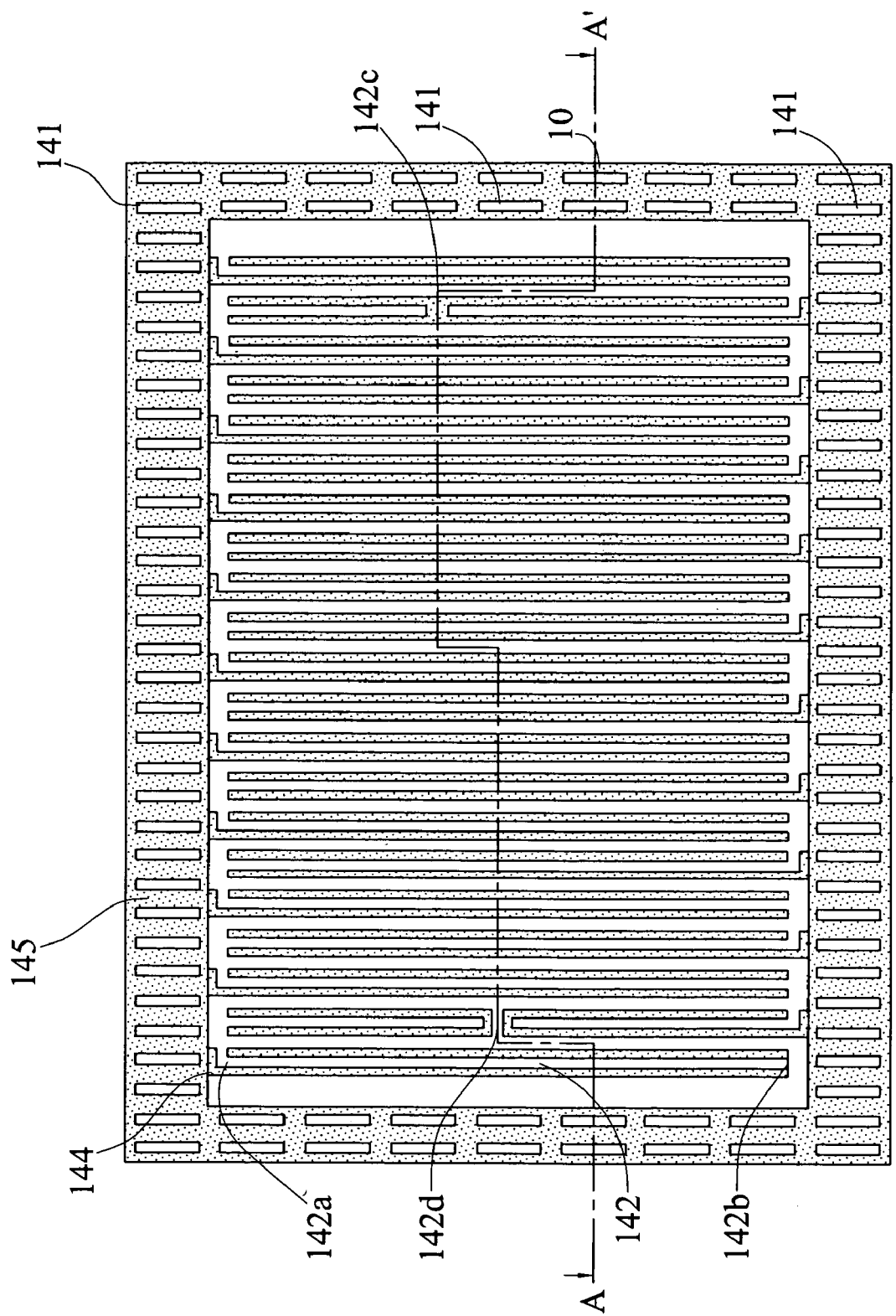
FIG. 2F is a schematic top-view diagram illustrating the formation of spacer pattern on the conductive layer by removing dummy pattern in accordance with an embodiment of the present invention.

FIG. 1F and FIG. 2F are schematic cross-sectional and top-view diagrams respectively illustrating the formation of the spacer patterns 144 and 145 on the conductive layer 10 by removing the dummy grounding and sampling patterns 141 and 142 in accordance with an embodiment of the present invention. The dummy sampling patterns 142 and grounding patterns 141 are removed by any suitable method. As a result, at the proximal ends 142a of the dummy sampling patterns 142 one of the two first spacers 144 on the opposite side walls of the sampling pattern 142 remains in contact with the second spacer 145 of the dummy grounding patterns 141, and at the distal ends 142b of the sampling patterns 142 the first spacers 144 on the opposite sidewalls of the sampling patterns 142 are isolated from each other. It is noted that the steps illustrated in FIG. 1E and FIG. 1F are interchangeable. That is, the removal of dummy patterns may be performed prior to the tip-cut removal of first spacers 144. It is also noted that the cross sectional diagram in FIG. 1F is taken from line A-A' in FIG. 2F.

Figure 2G:
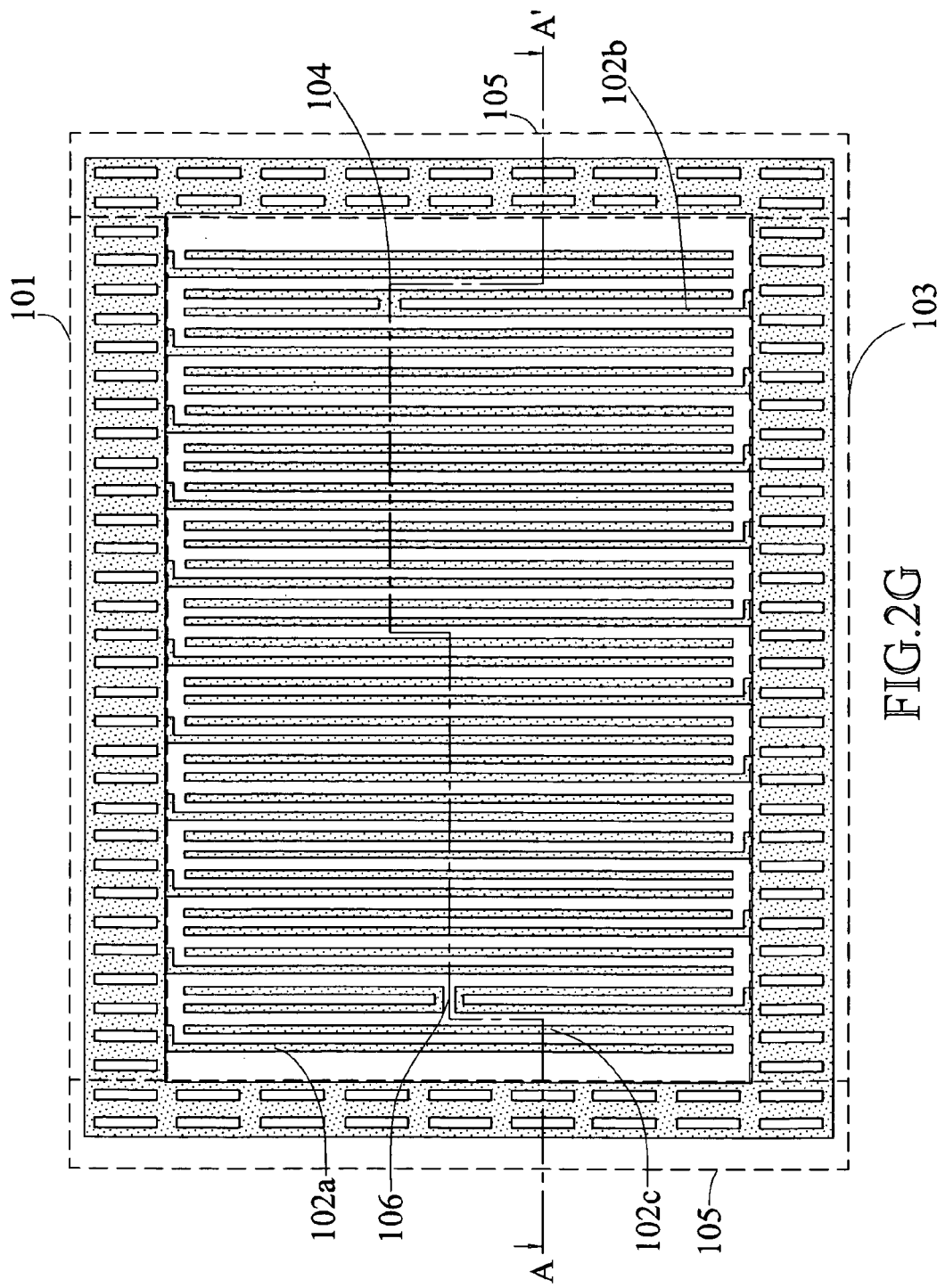
FIG. 2G is a schematic top-view diagram illustrating the formation of conductive layer pattern by removing the spacer in accordance with an embodiment of the present invention.

FIG. 1G is a schematic cross-sectional and top-view diagram illustrating an etched conductive layer 10 using the spacer pattern 144 and 145 as a mask in accordance with an embodiment of the present invention. As shown, a portion of the conductive layer 10 is removed using the first spacers 144 and the second spacers 145 as a mask. Referring now to FIG. 1H and FIG. 2G, which illustrate the formation of a conductive layer pattern (101, 102a, 102b, 102c, 103) by removing the first and second spacers 144 and 145 from a cross-sectional view and a top view, respectively. FIG. 1H is taken along A-A' line of FIG. 2G. The first and second spacers 144 and 145 are removed to expose the underneath conductive layer 10. As a result, the same pattern layout originally displayed by the first and second spacers 144 and 145 are formed from the remaining conductive layer 10 right underneath the first and second spacers 144 and 145, as illustrated in FIG. 1H and FIG. 2G. As shown, in the remaining conductive layer 10, a plurality of sampling lines 102a, 102b, and 102c are formed at locations corresponding to the first spacers 144 and a plurality of first grounding lines 101 and second grounding lines 103 are formed at locations corresponding to the second spacers 145. Each of the sampling lines 102a, 102b and 102c are formed separated from one another. At least one of the sampling lines 102a and 102b is grounded by being electrically coupled with the first grounding line 101 or the second grounding line 103, and at least one of the sampling lines 102c is floating by being electrically isolated from the grounding lines 101, 103 and from the grounded sampling lines 102a and 102b. The sampling lines 102a, 102b and 102c are arranged to form a repeating cycle of 102a, 102b and 102c.

The sampling lines 102a, 102b and 102c, which are located between a group of the first grounding lines 101 and second grounding lines 103, have at least one programmed short defect 104 and open defect 106 at locations corresponding to the programmed defect patterns 142c and 142d mentioned earlier in conjunction with FIG. 2B. Furthermore, each of the sampling lines 102a, 102b and 102c is separated from one another. It is noted that the first grounding lines 101 and second grounding lines 103 may be isolated or separated from each other. Alternatively, the first grounding lines 101 and second grounding lines 103 may be connected with each another through additional grounding lines 105, as shown in FIG. 2G. It is also noted that as shown in FIG. 1H, the first and second grounding lines 101 and 103 are electrically connected to the substrate 19 through contact holes 10A. As the potential of the substrate 19 will not change when the grounding lines 101 and 103 on the surface are scanned by the charged particle beam, the potential of grounding lines 101 and 103 can also be maintained when scanned, thus they are "virtually" grounded. Similarly, in examples where additional grounding lines 105 are used, the grounding lines 105 can also be connected to the substrate 19 to be grounded.

In the present example as shown in FIG. 2G, the sampling lines 102a are electrically coupled to the first grounding lines 101, and the sampling lines 102b are electrically coupled to the second grounding lines 103 as a result of the tip-cut step illustrated in FIGS. 2D and 2E. The two groups of the grounding lines 101 and 103 may be either separated from each other or connected to each other through additional grounding lines 105. In addition, as shown in FIG. 2G, the sampling lines 102c are floating, isolated from both the grounding lines 101 and 103, and grounded sampling lines 102a and 102b. Furthermore, the sampling lines 102a, 102c and 102b form a repeating cycle.

Figure 2H:
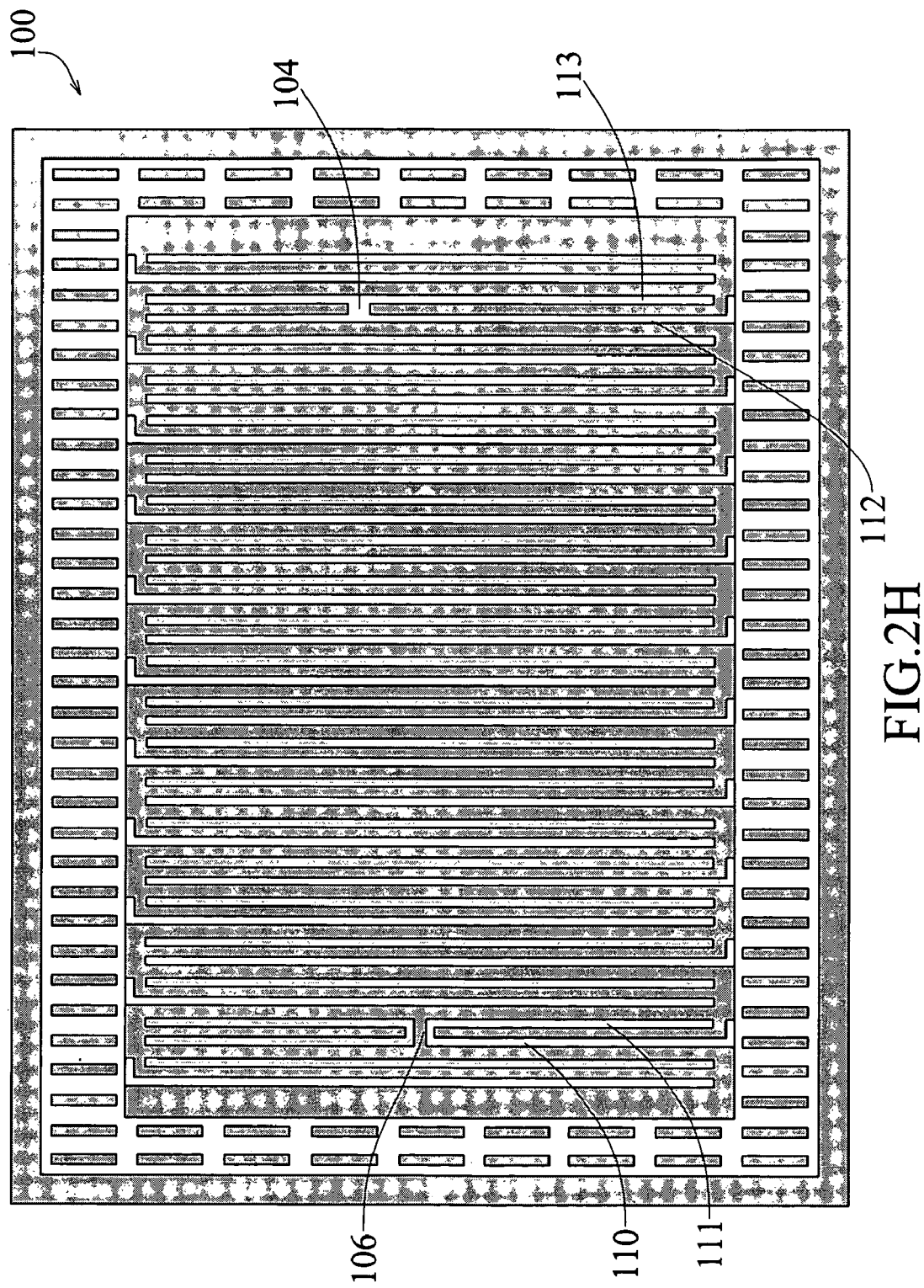
FIG. 2H is a schematically top-view diagram illustrating the voltage contrast image of the test structure in accordance with an embodiment of the present invention.
Figure 2I:
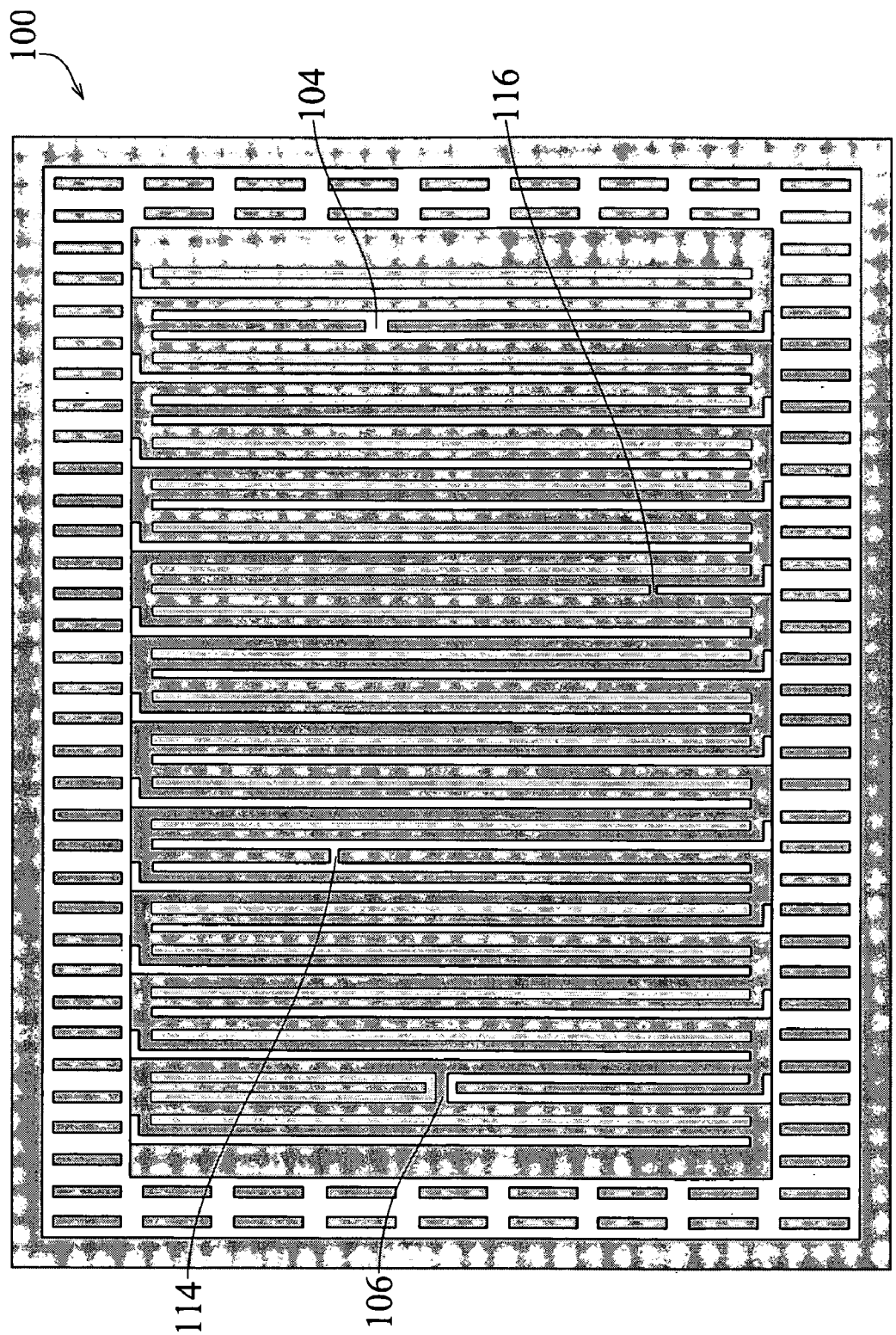
FIG. 2I is a schematic top-view diagram illustrating the voltage contrast image of the test structure in accordance with an embodiment of the present invention.
Figure 2J:
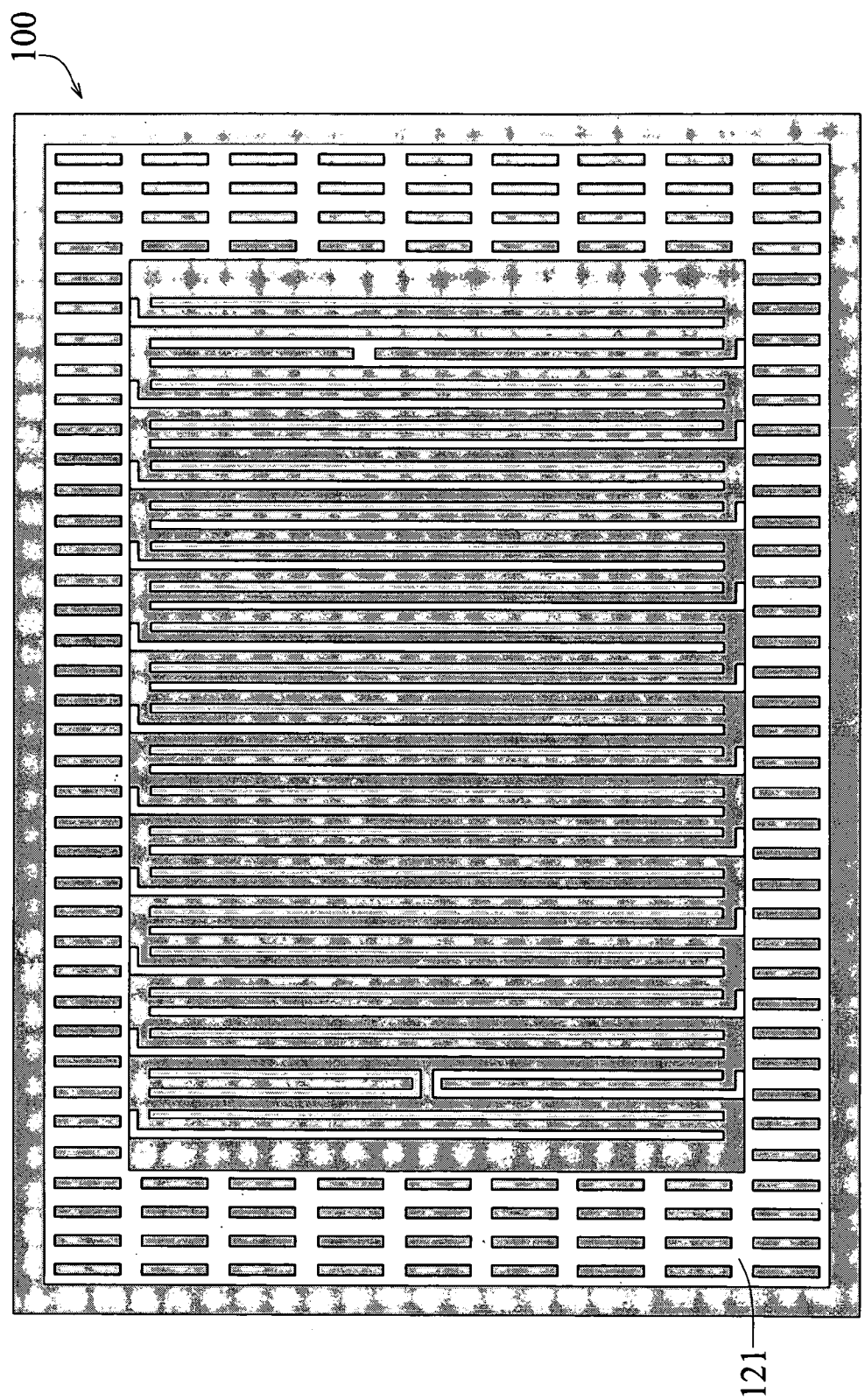
FIG. 2J is a schematic top-view diagram illustrating the voltage contrast image of the test structure in FIG. 1I.

Semiconductor defect test structures are designed such that they are sensitive to defects occurring in IC products, and are designed to more readily ascertain the presence of defects. Such defect test structures often are constructed on the same semiconductor substrate as the IC products and are used for the voltage contrast (VC) image observation. In such systems, a charged particle beam, such as an electron beam, is irradiated on the defect test structures. The interaction of the electron beam with features in the circuitry generates a number of signals in varying intensities and types, such as secondary electrons, back-scattered electrons, x-rays, etc. Typically, the electron beam methods employ secondary electron signals to form voltage contrast images for circuit pattern defect detection. The voltage contrast image technique operates on the principles that different locations on a test structure under examination give rise to varying secondary electron emission intensities. In one form of inspection, the abnormal voltage contrast between two or more locations on a test structure reveals the defect location. The potential of the scanned area is displayed as a voltage contrast image such that a low potential portion of, for example, a wiring pattern might be displayed as bright voltage contrast (intensity of the secondary electron emission is high) and a high potential portion on the other hand, might be displayed as dark voltage contrast (lower intensity secondary electron emission). Alternatively, the system may be configured such that a low potential portion might be displayed dark and a high potential portion displayed bright, respectively. FIG. 2H is a schematic top-view diagram illustrating the voltage contrast image of the test structure in accordance with an embodiment of the present invention. When the exemplary test structure 100 is used for defect inspection, the voltage contrast image is acquired. In the case of no defect, the inspected test structure 100 is supposed to display a bright voltage contrast and a dark voltage contrast in alternation. Comparing FIGS. 2G and 2H, as shown, the programmed open defect 106 and short defect 104 of the test structure 100 respectively display a darker (grey) voltage contrast at a location where a bright (white) voltage contrast should have been observed, and a bright voltage contrast at a location where a darker voltage contrast should have been observed. It is this abnormality in voltage contrast grey level which helps identifying the locations and types of defects in the test structure and can be used for inspecting the physical or electrical characteristics of the semiconductor/electrical device, or for verifying the manufacturing process at interest, such as an etching process. As shown, the upper half of the grounded sampling line 110 is harder to be observed in the VC grey level because it is separated, by the programmed open defect 106, from the bottom half of sampling line 110 which is connected to the bottom grounding lines. Therefore, the upper half of sampling line 110 is floating, resulting in a darker VC. Note that in the programmed open defect 106, the bottom half of sampling line 110 is connected to the bottom half of neighboring floating sampling line 111 i.e. it is shorted to bottom half of sampling line 111, therefore both of them display a bright VC. On the other hand, as the programmed short defect 104 connects the grounded sampling line 112 and the floating sampling line 113, they both display a bright VC. Referring to FIG. 2I, which is a schematic top-view diagram illustrating the voltage contrast image of the test structure 100 in accordance with another embodiment of the present invention. As shown, aside from the programmed defect 104 and 106, an actual process short defect 114 and an actual process open defect 116 are illustrated. In addition, it is noted that the example test structures illustrated in FIG. 2H, 2I and 2J are surrounded by a frame of oxide material which exhibits a darker VC.

As mentioned earlier, in the embodiments of the present invention, the groundling lines of the disclosed test structure are grounded by electrical coupling with a semiconductor or electrical substrate whose potential is substantially not affected by the scanning charged particle beam. However, there are various approaches to ground the grounding lines as will be understood by those skilled in the art. Another example will be illustrated here. Reference will now be made to FIGS. 1I and 2J. FIG. 1I is a schematic cross-sectional diagram illustrating a test structure in accordance with an embodiment of the present invention, and FIG. 2J is a schematic top-view diagram illustrating the voltage contrast image of the test structure in FIG. 1I. In the test structure in FIG. 1I, no contact holes are used to connect the conductive layer patterns 101, 102a, 102b, 102c, and 103 to the underneath substrate 19. Instead, the grounding lines 101 and 103 are grounded by coupling more grounding lines together to form a grounding line pool 121, as shown in FIG. 2J. This grounding line pool 121 has a large capacitance and thus enhanced toleration of charging build-up resulted from the scanning of a charged particle beam. Therefore, the grounding line pool 121 can serve as a grounding mechanism by itself.

Although the present invention has been explained in relation to its preferred embodiment, it is to be understood that other modifications and variation can be made without departing the spirit and scope of the invention as hereafter claimed.

What is claimed is:
1. A test structure, comprising:
a first grounding line, disposed over a substrate;
a second grounding line, disposed over said substrate; and
a plurality of sampling lines, disposed over said substrate and between said first grounding line and said second grounding line, wherein at least one programmed defect is located in at least one of said sampling lines.

2. The test structure as claimed in claim 1, wherein said first grounding line is separated from said second grounding line.

3. The test structure as claimed in claim 1, wherein said first grounding line is connected to said second grounding line.

4. The test structure as claimed in claim 1, wherein each said sampling line is separated from one another.

5. The test structure as claimed in claim 1, wherein the location of said programmed defect is programmable.

6. The test structure as claimed in claim 1, wherein the type of said programmed defect comprises an electrical open or short.

7. The test structure as claimed in claim 1, wherein
at least one of said sampling lines is grounded by being electrically coupled with said first grounding line or said second grounding line; and
at least one of said sampling lines is un-grounded by being electrically isolated from said grounding lines and from said grounded sampling lines.

8. The test structure as claimed in claim 7, wherein said sampling lines are arranged such that said grounded sampling lines and said un-grounded sampling lines are interlaced.

9. The test structure as claimed in claim 7, wherein every other said grounded sampling line is electrically coupled with said first grounding line while the remaining said grounded sampling lines are electrically coupled with said second grounding line.

* * * * *